(12) United States Patent
Fu et al.

(10) Patent No.: US 12,051,641 B2
(45) Date of Patent: Jul. 30, 2024

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Yi-Min Fu, Taichung (TW); Chi-Ching Ho, Taichung (TW); Cheng-Yu Kang, Taichung (TW); Yu-Po Wang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 184 days.

(21) Appl. No.: 17/527,434

(22) Filed: Nov. 16, 2021

(65) Prior Publication Data
US 2023/0111192 A1    Apr. 13, 2023

(30) Foreign Application Priority Data
Oct. 13, 2021  (TW) ................................ 110138003

(51) Int. Cl.
| | |
|---|---|
| H01L 23/498 | (2006.01) |
| H01L 21/48 | (2006.01) |
| H01L 23/367 | (2006.01) |
| H01L 23/00 | (2006.01) |

(52) U.S. Cl.
CPC .... *H01L 23/49822* (2013.01); *H01L 21/4857* (2013.01); *H01L 21/486* (2013.01); *H01L 23/367* (2013.01); *H01L 23/49816* (2013.01); *H01L 23/49833* (2013.01); *H01L 23/49838* (2013.01); *H01L 24/73* (2013.01); *H01L 2224/73204* (2013.01); *H01L 2924/3511* (2013.01)

(58) Field of Classification Search
None
See application file for complete search history.

(56) References Cited

U.S. PATENT DOCUMENTS

| | | | | |
|---|---|---|---|---|
| 10,916,526 | B2* | 2/2021 | Chiu | H01L 25/50 |
| 11,764,188 | B2* | 9/2023 | Chia | H01L 21/568 |
| | | | | 257/774 |
| 2019/0057917 | A1* | 2/2019 | Tsai | H01L 21/565 |
| 2021/0280530 | A1* | 9/2021 | Chen | H01L 23/3736 |

* cited by examiner

*Primary Examiner* — Long Pham
(74) *Attorney, Agent, or Firm* — Kelly & Kelley, LLP

(57) ABSTRACT

Provided is an electronic package providing a circuit structure having auxiliary circuit layers. Further, an electronic component is disposed on the circuit structure and electrically connected to the auxiliary circuit layers. In addition, an encapsulant covers the electronic component, and the circuit structure is disposed on the package substrate having a plurality of main circuit layers, such that the main circuit layers are electrically connected to the auxiliary circuit layers. As such, a number of layers of the auxiliary circuit layers is used to replace a layer number configuration of the main circuit layers.

9 Claims, 7 Drawing Sheets

ELECTRONIC PACKAGE AND MANUFACTURING METHOD THEREOF

BACKGROUND

1. Technical Field

The present disclosure relates to a semiconductor package, and more particularly, to an electronic package with a package module and a method for manufacturing the same.

2. Description of Related Art

With the increase in the demand for functions and processing speed of electronic products, the semiconductor chip as the core component of the electronic product needs to have higher density electronic components and electronic circuits. Hence, the semiconductor chip will generate a larger amount of heat when it is in operation.

Therefore, in order to quickly dissipate heat to the outside, the industry usually configures a heat sink or a heat spreader in the semiconductor package. The heat sink is usually bonded to the back of the chip by a heat-dissipating paste such that heat generated by the semiconductor chip can be dissipated by the heat-dissipating paste and the heat sink.

As shown in FIG. 1, a conventional method for manufacturing a semiconductor package 1 is to first dispose a semiconductor chip 11 with an active surface 11a thereof on a package substrate 10 in a flip-chip bonding manner (i.e., via conductive bumps 110 and an underfill 111). A top plate 130 of a heat sink 13 is subsequently bonded onto a non-active surface 11b of the semiconductor chip 11 by a heat-dissipating paste 12, and supporting legs 131 of the heat sink 13 are disposed on the package substrate 10 via the adhesive layer 14. During operation, heat generated by the semiconductor chip 11 is conducted to the top plate 130 of the heat sink 13 via the non-active surface 11b and the heat-dissipating paste 12 to dissipate heat to the outside of the semiconductor package 1.

However, as the semiconductor chip 11 has more and more functional requirements, the number of input/output (I/O) pins thereof is also increasing. Therefore, the demand for the number of circuit layers of the package substrate 10 increases, but the yield of the package substrate 10 with multiple circuit layers (such as 16 layers or more) is low, resulting in a substantial increase in the overall cost of the semiconductor package 1.

Therefore, there is a need for a solution that addresses the above-mentioned issues of the prior art.

SUMMARY

In view of the various above-mentioned shortcomings of the prior art, the present disclosure provides an electronic package, which includes: a package substrate having a plurality of main circuit layers; a package module disposed on the package substrate and including: a circuit structure disposed on the package substrate by a plurality of conductive components and having a plurality of auxiliary circuit layers electrically connected to the plurality of main circuit layers, wherein the circuit structure has a first surface and a second surface opposite to each other such that the second surface of the circuit structure is disposed on the package substrate via the plurality of conductive components, and a number of layers of the plurality of auxiliary circuit layers is used to replace the layer number configuration of the plurality of main circuit layers such that a number of layers of the plurality of main circuit layers is less than an original expected number of layers of the plurality of main circuit layers; an electronic component disposed on the first surface of the circuit structure and electrically connected to the plurality of auxiliary circuit layers, wherein the circuit structure extends out of sides of the electronic component; and an encapsulant formed on the first surface of the circuit structure to encapsulate the electronic component; and a packaging material formed between the package substrate and the package module to cover the plurality of conductive components.

The present disclosure further provides a method for manufacturing an electronic package, which includes: providing a circuit structure including a plurality of auxiliary circuit layers and a package substrate having a plurality of main circuit layers, wherein the circuit structure has a first surface and a second surface opposite to each other, and a number of layers of the plurality of auxiliary circuit layers is to replace a layer number configuration of the plurality of main circuit layers such that a number of layers of the plurality of main circuit layers is less than an original expected number of layers of the plurality of main circuit layers; disposing an electronic component on the first surface of the circuit structure and electrically connecting the electronic component with the plurality of auxiliary circuit layers, wherein the circuit structure extends out of sides of the electronic component; forming an encapsulant on the first surface of the circuit structure to encapsulate the electronic component to obtain a package module; disposing the second surface of the circuit structure of the package module on the package substrate having the plurality of main circuit layers via a plurality of conductive components, wherein the plurality of main circuit layers are electrically connected to the plurality of auxiliary circuit layers via the plurality of conductive components; and forming a packaging material on the package substrate, wherein the packaging material covers the plurality of conductive components.

In the aforementioned electronic package and method for manufacturing the same, the circuit structure has a vertical projected area that is smaller than a vertical projected area of the package substrate.

In the aforementioned electronic package and method for manufacturing the same, the plurality of auxiliary circuit layers have a single layer that replaces 2 to 4 layers of the plurality of main circuit layers.

In the aforementioned electronic package and method for manufacturing the same, the package substrate includes a core layer and build-up structures disposed on opposite sides of the core layer, and each of the build-up structures includes a plurality of dielectric layers and the plurality of main circuit layers bonded to the plurality of dielectric layers. For example, the number of layers of the plurality of main circuit layers of the package substrate is at least ten.

In the aforementioned electronic package and method for manufacturing the same, the package substrate has an area that is at least 60×60 mm$^2$.

In the aforementioned electronic package and method for manufacturing the same, the electronic component has a plurality of electrode pads electrically connected to the plurality of auxiliary circuit layers, and a distance between the electrode pads is less than or equal to 60 μm.

In the aforementioned electronic package and method for manufacturing the same, the plurality of auxiliary circuit layers of the circuit structure facing a side of the package substrate have a plurality of electrical contact pads, and a distance between the electrical contact pads is 80 μm to 150 μm or 200 μm to 300 μm.

The aforementioned electronic package and method for manufacturing the same further include disposing a plurality of ball pads on another side of the package substrate opposite to the package module, wherein a distance between the ball pads is 500 μm to 1,000 μm.

The aforementioned electronic package and method for manufacturing the same further include disposing a heat sink on the package substrate for heat dissipation of the package module.

As can be understood from the above, in the electronic package and method for manufacturing the same of the present disclosure, the number of layers of circuit layers of the high-density layout specifications required by the electronic package that is mainly configured in the circuit structure to reduce the demand for the number of layers of the circuit layers of the package substrate and to enable the number of layers of the auxiliary circuit layers and the number of layers of the main circuit layers have a complementary relationship. Therefore, compared with the prior art, the electronic package of the present disclosure uses the number of layers of the auxiliary circuit layers to replace a layer number configuration of the main circuit layers, such that the number of layers of the main circuit layers is less than the original expected number of layers of the main circuit layers. As a result, since the number of layers of main circuit layers of the package substrate needed is greatly reduced, the yield of the package substrate can be improved, and the overall cost of the electronic package can be reduced.

Further, the present disclosure uses a single auxiliary circuit layer to replace the multi-layer main circuit layer design such that the overall thickness of the electronic package can be relatively thin, and the volume of the electronic package of the present disclosure can be greatly reduced.

Additionally, in the present disclosure, the package substrate has a core layer configuration, which can improve the overall structural strength such that the present disclosure can avoid the problem of warpage during the manufacturing process.

BRIEF DESCRIPTION OF DRAWINGS

FIGS. 2A to 2C and 2D-1 are schematic cross-sectional views illustrating a method for manufacturing an electronic package in accordance with the present disclosure.

FIG. 2D-2 is a schematic cross-sectional view illustrating another method for manufacturing an electronic package of FIG. 2D-1.

DETAILED DESCRIPTION

Figure 1:
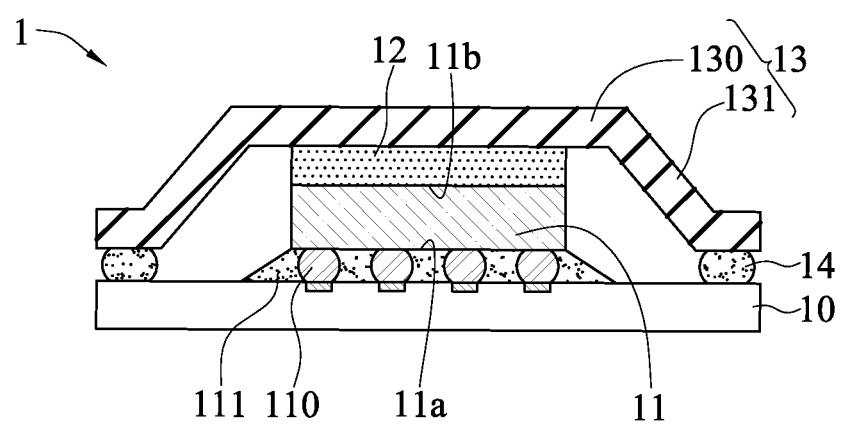
FIG. 1 is a schematic cross-sectional view of a conventional semiconductor package.

Implementations of the present disclosure are illustrated using the following embodiments. One of ordinary skill in the art can readily appreciate other advantages and technical effects of the present disclosure upon reading the content of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Any modifications, changes or adjustments to the structures, ratio relationships or sizes, are to be construed as falling within the range covered by the technical content disclosed herein to the extent of not causing changes in the technical effects created and the objectives achieved by the present disclosure, Meanwhile, terms such as "above," "first," "second," "a," "an," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIGS. 2A to 2D-1 are schematic cross-sectional views illustrating a method for manufacturing an electronic package 2 in accordance with the present disclosure.

Figure 2A:
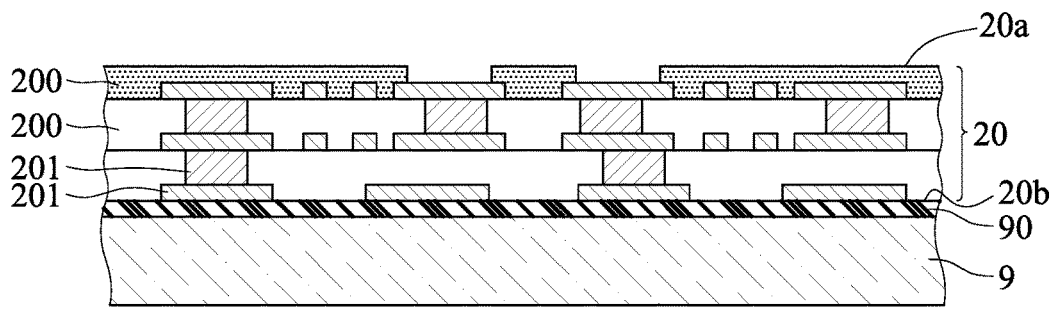

As shown in FIG. 2A, a circuit structure 20 is formed on a carrier 9. The circuit structure 20 is defined with a first surface 20a and a second surface 20b opposite to each other, and the circuit structure 20 is bonded onto the carrier 9 with the second surface 20b thereof.

In an embodiment, the carrier 9 is a metal plate, a semiconductor wafer, or a glass plate, such as a temporary full-panel silicon (Si) wafer, on which a sacrificial release layer 90 is disposed such that the circuit structure 20 is bonded onto the sacrificial release layer 90.

Further, the circuit structure 20 is, for example, a coreless substrate, which includes at least one insulating layer 200 and at least one auxiliary circuit layer 201 combined with the insulating layer 200, such as at least one fan-out redistribution layer (RDL). For example, the auxiliary circuit layer 201 at the first surface 20a of the circuit structure 20 has a plurality of input/output (I/O) pins, and the pitch specification thereof is micron-level (μ-Pad).

In addition, the material forming the auxiliary circuit layer 201 is copper, and the material forming the insulating layer 200 is a dielectric material such as polybenzoxazole (PBO), polyimide (PI) and prepreg (PP) or the like, or a solder-proof material such as solder mask or graphite.

Figure 2B:
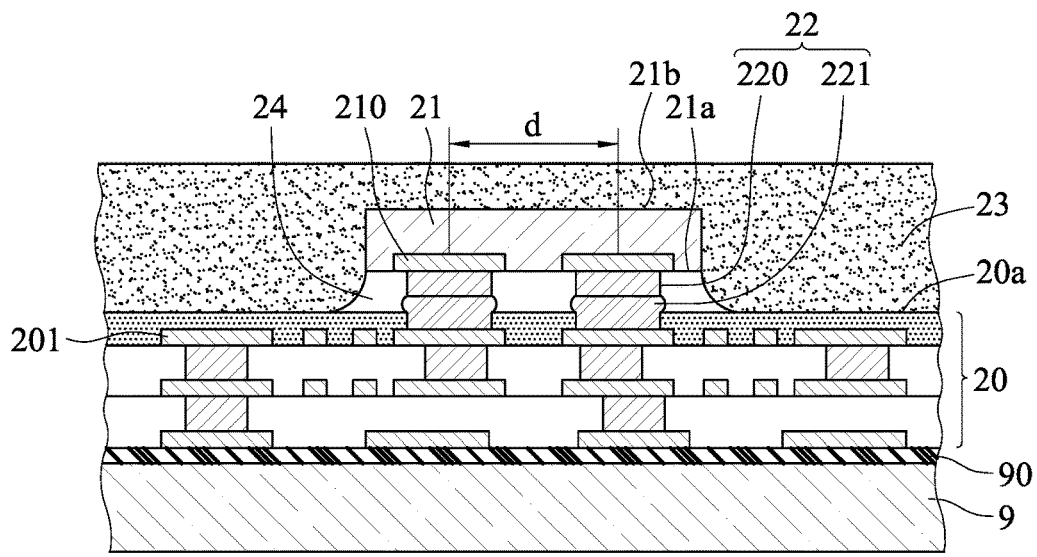

As shown in FIG. 2B, an electronic component 21 is connected onto the first surface 20a of the circuit structure 20 via a plurality of conductive structures 22 such that the electronic component 21 is electrically connected to the auxiliary circuit layer 201. Subsequently, an encapsulant 23 is formed on the first surface 20a of the circuit structure 20 such that the encapsulant 23 encapsulates the electronic component 21 (e.g., in an encapsulating manner).

In an embodiment, the electronic component 21 is an active component, a passive component, or a combination thereof. For example, the active component is a semiconductor chip, and the passive component is, for example, a resistor, a capacitor, or an inductor. For example, the electronic component 21 is a semiconductor chip, which has an active surface 21a and a non-active surface 21b opposite to each other. The active surface 21a has a plurality of electrode pads 210, which are disposed on the auxiliary circuit layer 201 of the first surface 20a of the circuit structure 20 and electrically connected to the auxiliary circuit layer 201 via the plurality of conductive structures 22 such as solder materials, metal pillars or others in a flip-chip manner, and the conductive structures 22 are covered with insulating materials 24 such as an underfill or a non-conductive underfill film (NCF), etc. Alternatively, the electronic component 21 may be electrically connected to the auxiliary circuit layer 201 of the first surface 20a of the circuit structure 20 by means of a plurality of bonding wires in a wire-bonding manner (not shown). Alternatively, the electronic component 21 may directly contact the auxiliary circuit layer 201 of the first surface 20a of the circuit structure 20. Therefore, there are many ways to electrically connect the electronic component 21 to the circuit structure 20, but not limited to the above.

Moreover, the distance d between the electrode pads 210 is less than or equal to 60 μm, and the conductive structure 22 includes a conductor 220 bonded to the electrode pad 210 and a solder material 221 bonded to the conductor 220 and the auxiliary circuit layer 201. For example, the conductor 220 may be a metal pillar such as a copper pillar.

Besides, the encapsulant 23 is an insulating material, such as a polyimide (PI), a dry film, an encapsulation colloid such as epoxy resin, or molding compound. For example, the encapsulant 23 may be formed on the circuit structure 20 by means of liquid compound, injection, lamination or compression molding, etc.

In addition, the insulating material 24 may be formed between the active surface 21a of the electronic component 21 and the first surface 20a of the circuit structure 20 to cover the conductive structures 22, and then the encapsulant 23 covers the insulating material 24. Alternatively, the insulating material 24 is free from being formed such that the encapsulant 23 directly covers the conductive structures 22.

Figure 2C:
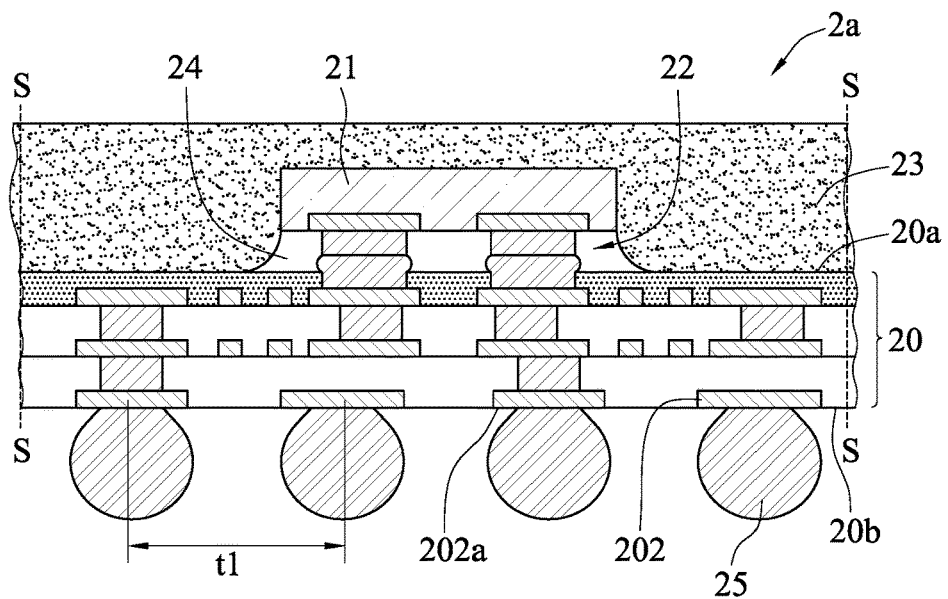

As shown in FIG. 2C, the carrier 9 and the sacrificial release layer 90 thereon are removed to expose the second surface 20b of the circuit structure 20, and then a plurality of conductive components 25 (such as solder bumps) are formed on the second surface 20b of the circuit structure 20.

In an embodiment, the auxiliary circuit layer 201 has a plurality of electrical contact pads 202 at the second surface 20b, and the surface 202a of the electrical contact pad 202 is flushed with the second surface 20b of the circuit structure 20. For example, the distance t1 between the electrical contact pads 202 is 80 to 150 μm or 200 to 300 μm.

Furthermore, an under bump metallurgy (UBM) (not shown) may be formed on the electrical contact pad 202 to facilitate the bonding of the conductive component 25.

Figures 1, 2D:
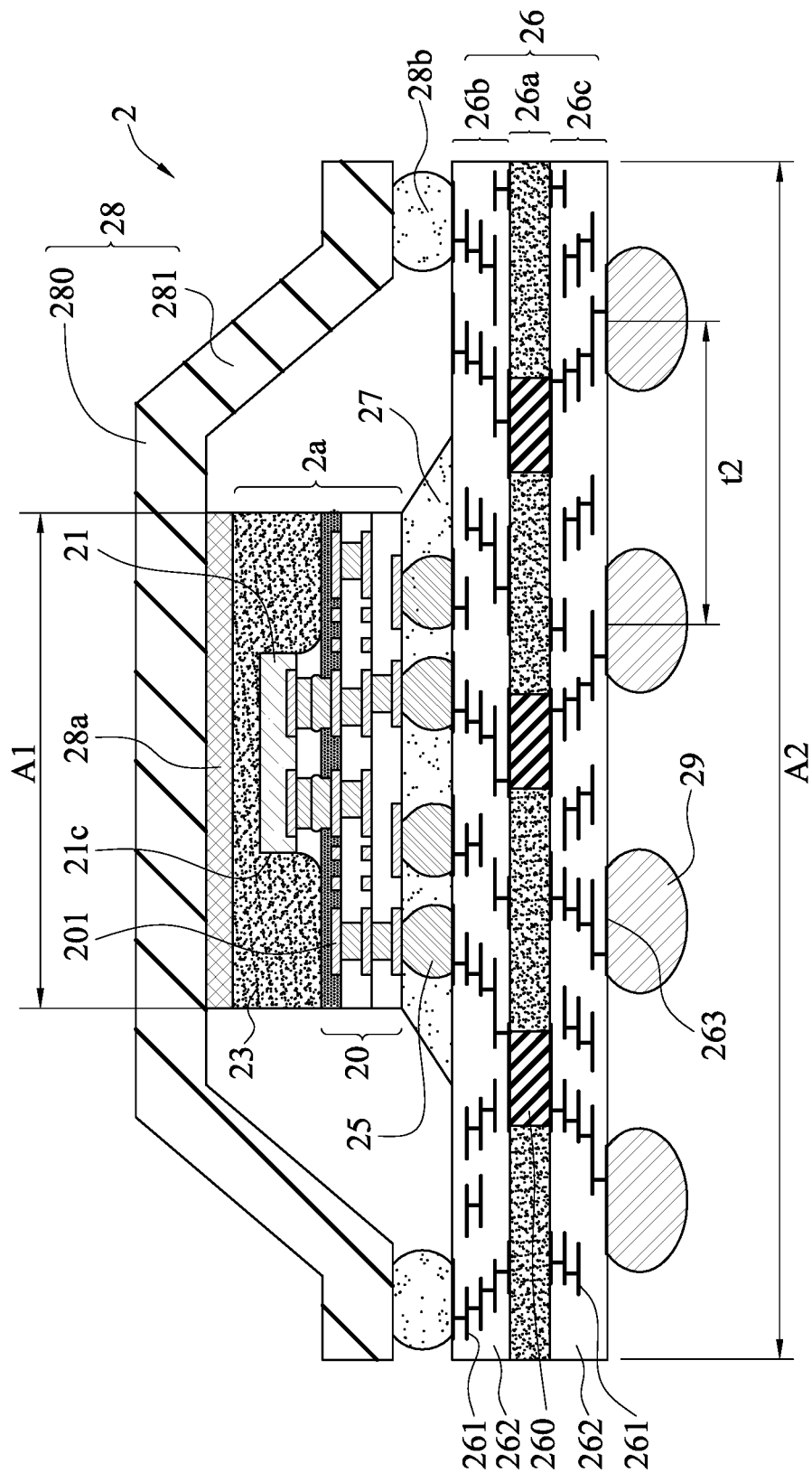

As shown in FIG. 2D-1, a singulation process is performed along a cutting path S shown in FIG. 2C to obtain a plurality of package modules 2a, and the circuit structure 20 extends out of sides 21c of the electronic component 21. Subsequently, the package module 2a is disposed onto a package substrate 26 via the conductive components 25, and a packaging material 27 (such as an underfill) is formed on the package substrate 26 such that the packaging material 27 covers the conductive components 25. After that, a heat sink 28 is disposed on the package substrate 26 to cover the package module 2a.

Figures 2, 2D:
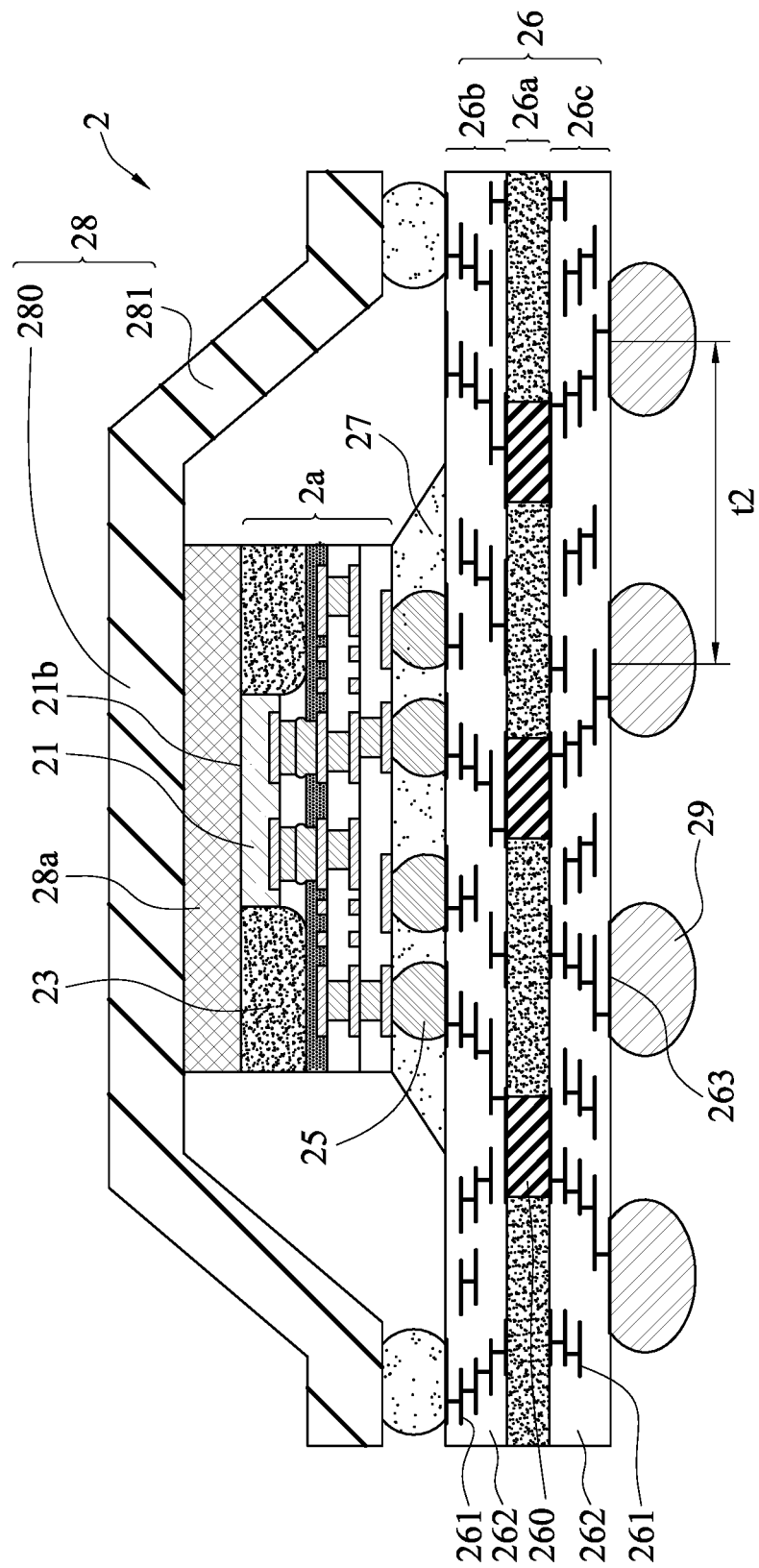
Figure 2E:
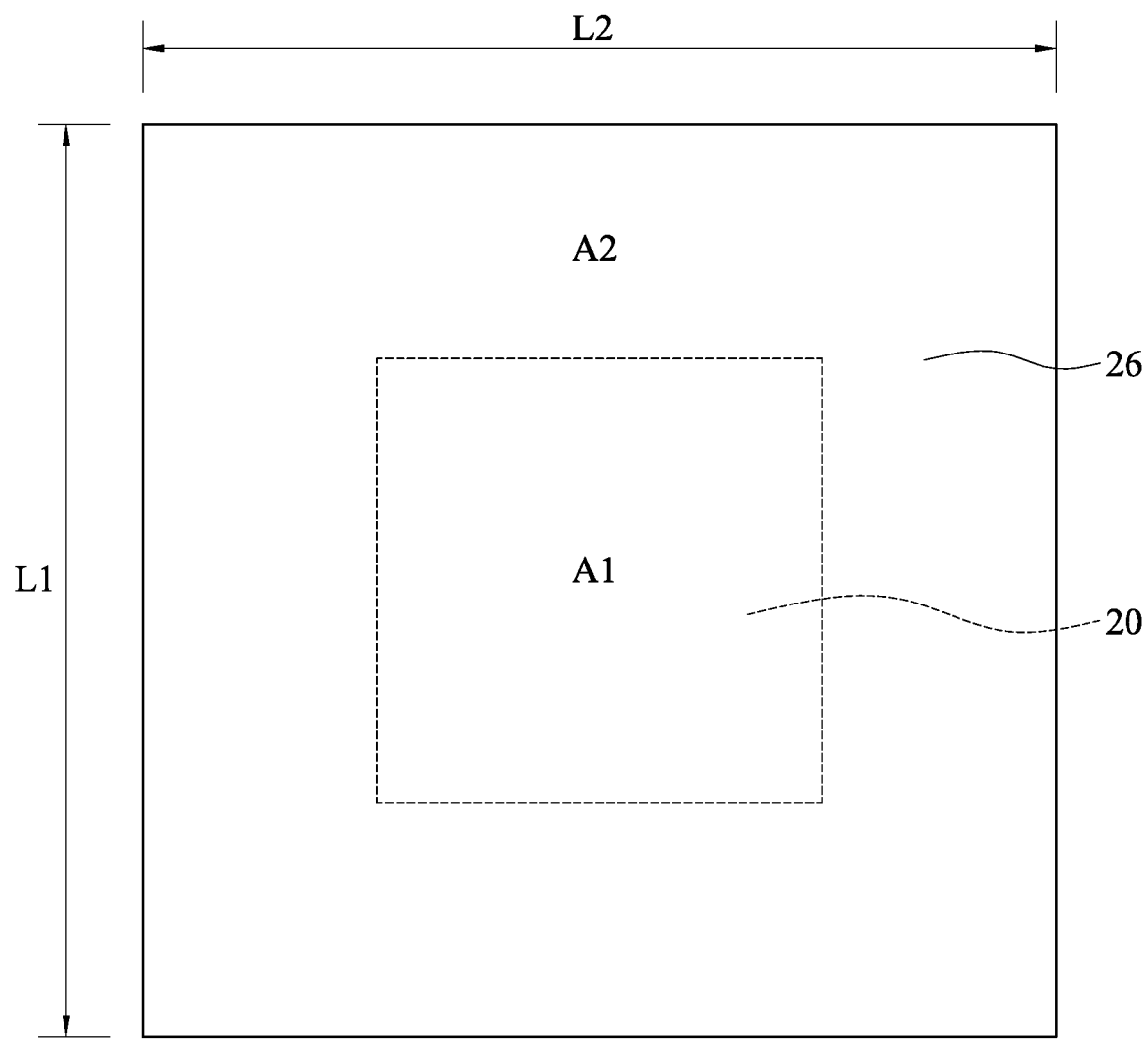
FIG. 2E is a schematic partial bottom view of FIG. 2D-1.

In an embodiment, the area of the surface of the package substrate 26 connected to the package module 2a is a large-size version, which is at least 60×60 mm$^2$ (a square with the same length L1 and width L2 as shown in FIG. 2E or a rectangle) such that the vertical projected area A1 of the circuit structure 20 is smaller than the vertical projected area A2 of the package substrate 26, as shown in FIGS. 2D-1 and 2E. In addition, the package substrate 26 includes a core layer 26a and build-up structures 26b, 26c disposed on opposite sides of the core layer 26a, wherein the core layer 26a has conductive vias 260, and each of the build-up structures 26b, 26c has a dielectric body 262 composed of a plurality of dielectric layers and the main circuit layers 261 of the conductive vias 260 bonded to and electrically connected to the plurality of dielectric layers. For example, the material forming the main circuit layers 261 is copper, and the material forming the dielectric body 262 is a dielectric material such as polybenzoxazole (PBO), polyimide (PI) and prepreg (PP).

Moreover, the heat sink 28 has a heat-dissipating body 280 and a plurality of supporting legs 281 extending downward from the edge of the heat-dissipating body 280. The heat-dissipating body 280 is a type of heat sink, and the lower side of the heat-dissipating body 280 is bonded onto the encapsulant 23 of the package module 2a by pressing a heat dissipation material 28a such that the heat dissipation material 28a is located between the heat-dissipating body 280 and the electronic component 21, and the supporting legs 281 are bonded onto the package substrate 26 by an adhesive layer 28b. Alternatively, the package module 2a may be flattened by a flattening process (such as a grinding method) to make the non-active surface 21b of the electronic component 21 flush with the surface of the encapsulant 23, as shown in FIG. 2D-2. Consequently, the non-active surface 21b of the electronic component 21 is exposed from the encapsulant 23 to contact the heat dissipation material 28a. For example, the heat dissipation material 28a is a thermal interface material (TIM), a solder material, a metal material or other thermally conductive materials.

Figure 3:
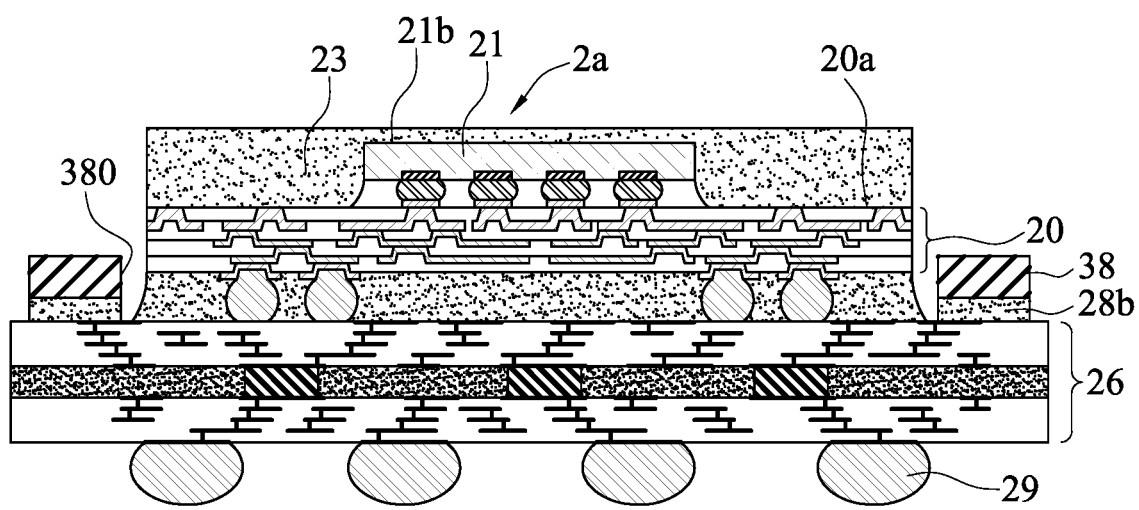
FIG. 3 is a schematic cross-sectional view illustrating an electronic package in accordance with another embodiment of the present disclosure.

Furthermore, in another embodiment, as shown in FIG. 3 for the electronic package 3, the heat sink 38 may also be a ring body, and the lower side of the heat sink 38 is bonded onto the package substrate 26 by the adhesive layer 28b. In addition, the heat sink 38 has an opening 380 corresponding to the position of the package module 2a such that the package module 2a is exposed from the opening 380, and can even protrude from the opening 380 as required. It should be understood that the non-active surface 21b of the electronic component 21 does not need to be exposed from the encapsulant 23.

Besides, in the subsequent manufacturing process, the plurality of ball pads 263 of the main circuit layers 261 on the lower side of the package substrate 26 can be bonded with the solder balls 29 such that the electronic packages 2, 3 are connected to an electronic device (such as a circuit board) (not shown) by the solder balls 29. For example, the distance t2 between the ball pads 263 is 500 to 1000 μm.

As such, by disposing the electronic component 21 on a circuit structure 20 in the form of a redistribution layer (RDL) to produce the package module 2a, the electrode pad 210 of the electronic component 21 can be connected onto the package substrate 26 via the circuit structure 20. Hence, the pitch specification of the input/output (I/O) pins (i.e., the positions corresponding to the conductive structures 22) of the auxiliary circuit layers 201 on the first surface 20a of the circuit structure 20 can match the input/output (I/O) pin pitch specification of the electronic component 21 (for example, the distance d≤60 μm between the electrode pads 210). Additionally, the pitch specification of the input/output (I/O) pins (for example, the distance t1 between the electrical contact pads 202 is 80 to 150 μm or 200 to 300 μm) of the auxiliary circuit layers 201 on the second surface 20b of the circuit structure 20 can match the pitch specification of the input/output (I/O) pins (i.e., the positions corresponding to the conductive components 25) of the package substrate 26. As a result, the package substrate 26 can be manufactured using existing processes (for example, the input/output [I/O] pin pitch corresponding to each conductive component 25 is made to be 130 µm), and can still be packaged with the electronic components 21 of advanced specifications to form the required multifunctional electronic packages 2, 3, thereby facilitating the development of electronic products using the electronic packages 2, 3.

Furthermore, as the functional requirements of the electronic component 21 increase, the number of input/output (I/O) pins thereof also increases. In order to meet the number of input/output (I/O) pins, the conventional package substrate 10 needs to be designed with more than 16 layers before layout. Therefore, the number of layers of circuit layers of high-density layout specifications required by the electronic package 2, 3 are disposed in the circuit structure 20 of the package module 2a (i.e., the number of layers of the auxiliary circuit layers 201) so as to reduce the requirement for the number of layers of circuit layers (i.e., the number of layers of the main circuit layers 261) of the package substrate 26. Consequently, the number of layers of the auxiliary circuit layers 201 and the number of layers of the main circuit layers 261 are in a complementary relationship. Therefore, compared with the prior art, the number of layers of circuit layers of the package substrate 26 required for the electronic packages 2 and 3 of the present disclosure is relatively low (for example, the number of layers of the main circuit layers 261 is less than ten). In addition, except that the auxiliary circuit layers 201 are used to assist and meet the process capability of the package substrate 26 (for example, the input/output (I/O) pin pitch being 80 to 150 µm), the number of layers of the auxiliary circuit layers 201 can further replace more layers of the main circuit layers 261 such that the number of layers of the package substrate 26 is reduced. Moreover, the input/output (I/O) pin pitch thereof can be designed to a larger specification of 200 to 300 µm, which further improves the yield of the package substrate 26 and reduces the cost of the package substrate 26, thereby reducing the overall cost of the electronic package 2, 3.

Additionally, since the RDL specification of the circuit structure 20 can produce a higher density pitch than the package substrate 26, each auxiliary circuit layer 201 in the form of RDL can replace 2 to 4 layers of the main circuit layers 261, and the configurations of the plurality of main circuit layers 261 and the auxiliary circuit layers 201 can meet the circuit functions required by the electronic component 21. Thus, compared with the prior art, the electronic package 2, 3 of the present disclosure can be relatively thinner in overall thickness (or height) such that the volume of the electronic package 2, 3 can be reduced.

For example, in view of the 16 circuit layers of the existing package substrate (i.e., each of the upper and lower surfaces of the core layer 26a has one main circuit layer 261, that is, there are two layers in total, and there are 7 main circuit layers 261 on the upper and lower sides of the core layer 26a to form build-up structures 26b, 26c such that the number of layers can be expressed as 7/2/7), if one auxiliary circuit layer 201 in the form of RDL replaces two main circuit layers 261 of the package substrate 26, the number of layers of the main circuit layers 261 of the package substrate 26 is configured to become 6/2/6 when the circuit structure 20 has only one auxiliary circuit layer 201. Alternatively, when the circuit structure 20 has three auxiliary circuit layers 201, as shown in FIG. 2D-1, the number of layers of the main circuit layers 261 of the package substrate 26 is configured to become 4/2/4, and so on.

Similarly, if one auxiliary circuit layer 201 in the form of RDL replaces four main circuit layers 261 of the package substrate 26, the number of layers of the main circuit layers 261 of the package substrate 26 is configured to become 5/2/5 when the circuit structure 20 has only one auxiliary circuit layer 201. Alternatively, when the circuit structure 20 has two auxiliary circuit layers 201, the number of layers of the main circuit layers 261 of the package substrate 26 is configured to become 3/2/3, and so on.

It should be understood that if the number of layers of the auxiliary circuit layers 201 is greater, the number of layers of the main circuit layers 261 of the package substrate 26 is less.

Figure 4:
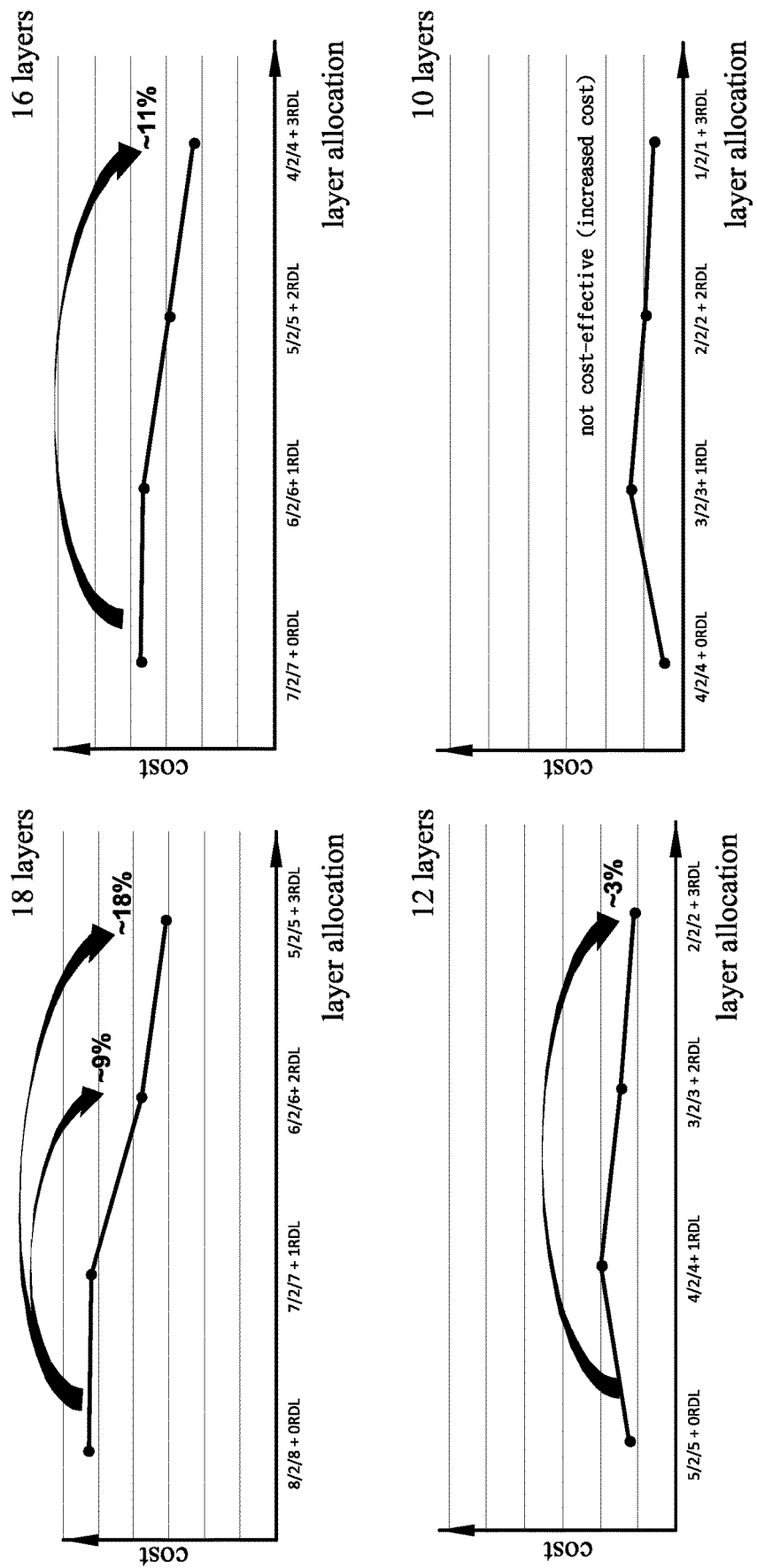
FIG. 4 is a graph illustrating a cost-benefit comparison of the electronic package in accordance with the present disclosure.

Preferably, since a single auxiliary circuit layer 201 can replace 2 to 4 layers of the main circuit layers 261, compared with the package substrate 26 that originally requires more than 16 layers, the circuit structure 20 that replaces some layers of the main circuit layers 261 is more cost-effective. That is, the more the number of layers of circuit layers originally required for the package substrate 26 is (as shown in FIG. 4, there are more than 16 layers or even more 18 layers), the better the cost-effectiveness of the overall package structure is after the circuit structure 20 is improved (as shown in FIG. 4, the cost is reduced by 11%, or even reduced by 18%). Conversely, if the number of layers of circuit layers originally required for the package substrate 26 is less than 16 layers, as shown in FIG. 4, less than 12 layers, or even less than 10 layers, the cost can only be reduced by 3%, or even increased (10 layers as shown in FIG. 4). It should be understood that the circuit structure 20 that replaces more layers of the main circuit layers 261 is not better, instead, it needs to cooperate with the process capability, structural strength or other specification constraints and cost calculations to obtain the optimal layer allocation.

In addition, the manufacturing method of the present disclosure is mainly applied to the demand of high number of input/output (I/O) pins. Hence, the volume of the electronic package needs to be designed to be larger (for example, the area thereof is at least 60×60 mm$^2$). If a coreless substrate is used in the manufacturing process, warpage is likely to occur. As such, with the configuration of the package substrate 26 having the core layer 26a, the overall structural strength of the electronic packages 2, 3 can be improved to avoid the problem of warpage of the electronic packages 2, 3 due to large dimensions during manufacturing processes.

The present disclosure further provides an electronic package 2, 3, including: a package substrate 26 having a plurality of main circuit layers 261, a package module 2a disposed on the package substrate 26 and a packaging material 27. The package module 2a includes a circuit structure 20 disposed on the package substrate 26, at least one electronic component 21 disposed on the circuit structure 20 and an encapsulant 23 disposed on the circuit structure 20.

The circuit structure 20 has a plurality of auxiliary circuit layers 201 electrically connected to the plurality of main circuit layers 261. Besides, the circuit structure 20 has a first surface 20a and a second surface 20b opposite to each other such that the second surface 20b of the circuit structure 20 has a plurality of conductive components 25 which are disposed on the package substrate 26, and the number of layers of the auxiliary circuit layers 201 is used to replace the layer number configuration of the main circuit layers 261 such that the number of layers of the main circuit layers 261 is less than the original expected number of layers of the main circuit layers 261.

The electronic component 21 is disposed on the first surface 20a of the circuit structure 20 and electrically connected to the auxiliary circuit layer 201, wherein the circuit structure 20 extends out of the sides 21c of the electronic component 21.

The encapsulant 23 is disposed on the first surface 20a of the circuit structure 20 to encapsulate the electronic component 21.

The packaging material 27 is formed between the package substrate 26 and the package module 2a to cover the plurality of conductive components 25.

In an embodiment, the vertical projected area A1 of the circuit structure 20 is smaller than the vertical projected area A2 of the package substrate 26.

In an embodiment, the single layer of the plurality of auxiliary circuit layers 201 can replace 2 to 4 layers of the main circuit layers 261.

In an embodiment, the package substrate 26 includes a core layer 26a and build-up structures 26b, 26c disposed on opposite sides of the core layer 26a, and each of the build-up structure 26b, 26c includes a dielectric body 262 composed of a plurality of dielectric layers and the plurality of main circuit layers 261 bonded to the plurality of dielectric layers. For example, the number of layers of the main circuit layers 261 of the package substrate 26 is at least ten.

In an embodiment, the area of the surface of the package substrate 26 connected to the package module 2a is at least 60×60 mm² (a square with the same length L1 and width L2 as shown in FIG. 2E or a rectangle).

In an embodiment, the electronic component 21 has a plurality of electrode pads 210 electrically connected to the auxiliary circuit layer 201, and the distance d between the electrode pads 210 is less than or equal to 60 μm.

In an embodiment, the auxiliary circuit layer 201 of the circuit structure 20 facing the side of the package substrate 26 has a plurality of electrical contact pads 202, and the distance t1 between the electrical contact pads 202 is 80 to 150 μm or 200 to 300 μm.

In an embodiment, a plurality of ball pads 263 are disposed on another side of the package substrate 26 opposite to the package module 2a, and the distance t2 between the ball pads 263 is 500 to 1000 μm.

In an embodiment, the electronic package 2, 3 further includes a heat sink 28, 38 disposed on the package substrate 26 for heat dissipation of the package module 2a.

In summary, the electronic package and the manufacturing method thereof according to the present disclosure utilize the configuration of the circuit structure to enable the electronic component to be disposed on the package substrate according to the specification requirements. Therefore, the package substrate can be manufactured by using the existing manufacturing process to encapsulate electronic components of various specifications into the required multifunctional electronic package so as to facilitate the development of electronic products using the electronic package.

Moreover, the number of layers of circuit layers of high-density layout specifications required by the electronic package is configured in the circuit structure to reduce the demand for the number of layers of circuit layers of the package substrate. Therefore, since the number of layers of circuit layers of the package substrate required for the electronic package of the present disclosure is greatly reduced, the yield of the package substrate can be improved, and the overall cost of the electronic package can be reduced.

Further, a single auxiliary circuit layer can replace multiple main circuit layers such that the overall thickness of the electronic package of the present disclosure can be relatively thin, and the volume of the electronic package can be reduced.

Additionally, the package substrate has a core layer configuration, which improves the overall structural strength of the electronic package such that the present disclosure can avoid the problem of warpage during the manufacturing process.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
a package substrate having a plurality of main circuit layers;
a package module disposed on the package substrate and including:
a circuit structure disposed on the package substrate by a plurality of conductive components and having a plurality of auxiliary circuit layers electrically connected to the plurality of main circuit layers, wherein the circuit structure has a first surface and a second surface opposite to each other such that the second surface of the circuit structure is disposed on the package substrate via the plurality of conductive components, and a number of layers of the plurality of auxiliary circuit layers is used to replace a layer number configuration of the plurality of main circuit layers such that a number of layers of the plurality of main circuit layers is less than an original expected number of layers of the plurality of main circuit layers;
an electronic component disposed on the first surface of the circuit structure and electrically connected to the plurality of auxiliary circuit layers, wherein the circuit structure extends out of sides of the electronic component; and
an encapsulant formed on the first surface of the circuit structure to encapsulate the electronic component; and
a packaging material formed between the package substrate and the package module to cover the plurality of conductive components,
wherein the package substrate includes a core layer and build-up structures disposed on opposite sides of the core layer, and each of the build-up structures includes a plurality of dielectric layers and the plurality of main circuit layers bonded to the plurality of dielectric layers.

2. The electronic package of claim 1, wherein the circuit structure has a vertical projected area smaller than a vertical projection area of the package substrate.

3. The electronic package of claim 1, wherein the plurality of auxiliary circuit layers have a single layer replacing 2 to 4 layers of the plurality of main circuit layers.

4. The electronic package of claim 1, wherein the number of layers of the plurality of main circuit layers of the package substrate is at least ten.

5. The electronic package of claim 1, wherein the package substrate has an area of at least 60×60 mm².

6. The electronic package of claim 1, wherein the electronic component has a plurality of electrode pads electrically connected to the plurality of auxiliary circuit layers, and a distance between the electrode pads is less than or equal to 60 µm.

7. The electronic package of claim 1, wherein the plurality of auxiliary circuit layers of the circuit structure facing a side of the package substrate have a plurality of electrical contact pads, and a distance between the electrical contact pads is 200 mm to 300 mm or 80 mm to 150 µm.

8. The electronic package of claim 1, further comprising a plurality of ball pads disposed on another side of the package substrate opposite to the package module, wherein a distance between the ball pads is 500 mm to 1,000 µm.

9. The electronic package of claim 1, further comprising a heat sink disposed on the package substrate for heat dissipation of the package module.

* * * * *